United States Patent
Scholz et al.

(10) Patent No.: US 7,821,272 B2
(45) Date of Patent: Oct. 26, 2010

(54) METHOD FOR CALIBRATING AN ELECTROSTATIC DISCHARGE TESTER

(75) Inventors: Mirko Scholz, Leuven (BE); David Eric Tremouilles, Villeneuve (FR); Steven Thijs, Willebroek (BE); Dimitri Linten, Boortmeerbeek (BE)

(73) Assignee: IMEC, Leuven (BE)

( * ) Notice: Subject to any disclaimer, the term of this patent is extended or adjusted under 35 U.S.C. 154(b) by 318 days.

(21) Appl. No.: 12/051,749

(22) Filed: Mar. 19, 2008

(65) Prior Publication Data

US 2009/0027063 A1 Jan. 29, 2009

Related U.S. Application Data

(60) Provisional application No. 60/895,593, filed on Mar. 19, 2007.

(30) Foreign Application Priority Data

Sep. 14, 2007 (EP) .................................. 07116438

(51) Int. Cl.
  *G01R 35/00* (2006.01)
  *G01R 27/02* (2006.01)
(52) U.S. Cl. ...................................... 324/601; 324/605
(58) Field of Classification Search ................. 324/601, 324/74, 130, 202, 600, 76.11, 158.1, 605, 324/615, 618, 676, 637, 638, 678, 763, 765
See application file for complete search history.

(56) References Cited

U.S. PATENT DOCUMENTS

| | | | |
|---|---|---|---|
| 6,429,674 B1 | 8/2002 | Barth et al. | |
| 6,459,277 B1 * | 10/2002 | Sessions | 324/601 |
| 7,545,152 B2 * | 6/2009 | Grund | 324/605 |
| 2004/0239346 A1 | 12/2004 | Iyer et al. | |
| 2008/0004820 A1 | 1/2008 | Nakaie et al. | |

OTHER PUBLICATIONS

European Search Report for 08152960.4 dated May 8, 2008.
Juliano, Patrick A. et al., "Accurate Wafer-Level Measurement of ESD Protection Device Turn-On Using a Modified Very Fast Transmission-Line Pulse System", IEEE Transactions on Device and Materials Reliability, vol. 1, No. 2, Jun. 2001, pp. 95-103.

(Continued)

*Primary Examiner*—Hoai-An D Nguyen
(74) *Attorney, Agent, or Firm*—McDonnell Boehnen Hulbert & Berghoff LLP

(57) ABSTRACT

The present disclosure relates to a method for calibrating transient behaviour of an electrostatic discharge (ESD) test system. The system includes an ESD pulse generator and probe needles for applying a predetermined pulse on a device under test. The probe needles are connected to the ESD pulse generator via conductors. The test system includes measurement equipment for detecting transient behaviour of the device under test by simultaneously capturing voltage and current waveforms the device as a result of the pulse. The method includes the steps of: (a) applying the ESD test system on a first known system with a first known impedance, (b) applying the ESD test system on a second known system with a known second impedance, and (c) determining calibration data for the transient behaviour the ESD test system on the basis of captured voltage and current waveforms, taking into account said known first and second impedances. In preferred embodiments the waveforms are transferred to the frequency domain for correlation.

20 Claims, 10 Drawing Sheets

OTHER PUBLICATIONS

Barth, Jon E. et al., "TLP Calibration, Correlation, Standards, and New Techniques", IEEE Transactions on Electronics Packaging Manufacturing, vol. 24, No. 2, Apr. 2001, pp. 99-108.

Grund, Evan et al., "TLP Systems With Combined 50- and 500-ΩImpedance Probes and Kelvin Probes", vol. 28, No. 3, Jul. 2005, pp. 213-223.

Trémouilles, D. et al., "Transient Voltage Overshoot in TLP Testing—Real or Artifact", Microelectronics Reliability, vol. 47, vol. 7 (2007), pp. 1016-1024.

Mergens, Markus P.J. et al., "Diode-Triggered SCR (DTSCR) for RF-ESD Protection of BiCMOS SiGe HBTs and CMOS Ultra-Thin Gate Oxides", p. 21.3.1-21.3.4, IEDM 2003.

Brennan, Ciaran J. et al., "Implementation of Diode and Bipolar Triggered SCRs for CDM Robust ESD Protection in 90nm CMOS ASICs", Electrical Overstress/Electrostatic Discharge Symposium, 2005, EOS/ESD 2005, pp. 1-7.

* cited by examiner

METHOD FOR CALIBRATING AN ELECTROSTATIC DISCHARGE TESTER

BACKGROUND

The present disclosure relates to a method for calibrating transient behaviour of an electrostatic discharge (ESD) test system.

Several measurement methods are used to assess the robustness of devices under test (DUT) under Electrostatic Discharge (ESD). These methods apply predetermined, standardized pulses to the DUT in order to simulate an ESD event.

Human Body Model (HBM) and Machine Model (MM) testers make use of transient pulses having a fast rise time (e.g. 2-10 ns) and longer decaying times (e.g. about 150 ns). Recently, testers have been developed by which both the resulting voltage and current waveforms on the DUT can be captured. One such tester is the Hanwa HED-W5000M, described in Japanese Patent Application 2006-182908.

Transmission Line Pulse (TLP) testers use rectangular pulses of successively higher amplitudes, wherein the voltage (V) across and current (I) through the DUT are recorded at the top flat region of the applied pulses. Compiling these I-V point pairs, the TLP I-V curve is obtained. An exemplary TLP tester is disclosed in US 2004/0239346 A1.

Human body model (HBM) and transmission line pulse (TLP) testing are common measurement methods to assess the robustness of devices under electrostatic discharge (ESD) stress. While HBM is mainly used for product qualification, TLP is traditionally performed on stand-alone ESD protection structures as a tool for optimizing devices as well as assessing the intrinsic technology capabilities. One of the disadvantages of a conventional HBM tester is that, as a standardized ESD test method, it only yields 'pass-fail' data for product qualification. TLP has a major disadvantage because it is not a standard test to qualify a product. As a result, different testers are used for product development and qualification, which roughly doubles the time and effort spent to ensure ESD reliability.

In Gauthier, R. et al., "TLP Systems with Combined 50 and 500 Ohm Impedance Probes and Kelvin Probes," IEEE Transactions on Electronics Packaging Manufacturing, IEEE, vol. 28, no. 3, July 2005, pages 213-223, a measurement system with two different loadlines (50 and 500 Ohm) is presented which allows the study of a device under test in two different operation regions. Also, the Kelvin probe principle is applied to TLP testing in order to minimize the influence of contact resistance variations on the measurement data. A TLP system is discussed of which only a quasi-static (non-transient) calibration routine (resistance removal) is demonstrated.

Barth, J. et al., "TLP Calibration, Correlation, Standards and New Techniques", IEEE Transactions on Electronics Packaging Manufacturing, IEEE, vol. 24, no. 2, April 2001, pages 99-108, focuses on TLP measurement systems. Several topics are covered: quasi-static TLP measurement data and its calibration, study of correlation of TLP failure level to HBM failure level and dV/dt effects in TLP waveform data. The presented waveform studies look at the TLP waveform without providing a general calibration methodology for this type of measurement data. The demonstrated calibration methodology relates only to the quasi-static part of the waveform.

SUMMARY

The present disclosure provides methods for calibrating transient behaviour using an electrostatic discharge (ESD) test system. An ESD pulse generator is used. The pulse generator is equipped for simulating an ESD event on a device under test by applying a predetermined pulse to the device. Measurement equipment is provided to detect transient behaviour of the device by capturing voltage and current waveforms over the device as a result of said pulse. The present disclosure further provides methods for testing the ESD robustness of a device under test by means of such an ESD test system.

The usefulness of existing ESD test systems is limited in view of inaccuracies in the measurements that result from a transient response of the system. Such a transient response has not been well understood in the field of ESD, in part because in order to analyze the transient response of the system, accurate data is required in the first few nanoseconds of the ESD pulses. As a result, no calibration procedure up to now is believed to have been developed for ESD test systems to remove the artifacts caused by the system parasitics.

In methods disclosed herein, calibration data for the transient behaviour of the ESD test system is obtained by applying the test system at least once on one or more known systems, i.e. systems whose impedances during an ESD transient are known. The response of the system is then measured by means of the measurement equipment of the ESD test system itself. This measurement equipment can be incorporated into the ESD pulse generator or can be separate equipment, such as for example an oscilloscope. Once calibrated, the ESD test system can be used for simultaneously capturing the current and voltage waveforms over a DUT, saving on time and equipment. Using such calibration methods, it can become possible to extract the conventional IV (TLP) parameters by means of a wafer level standard HBM test system. Such methods may be applied for calibrating HBM, MM, TLP or any other ESD test systems.

The information present in simultaneously-captured voltage and current waveforms is significant as it can provide in-depth information on the transient response of the device under test, which can facilitate and improve the design of the ESD protection. This is a significant advantage, as transient device response can play an important role in ESD reliability for the entire spectrum of semiconductor devices—from low voltage deep sub-micron to high voltage technologies.

In methods described herein, the calibration data of the ESD test system can comprise a functional relationship, which is to be applied to a captured current waveform for obtaining a corrected current waveform; a parasitic impedance, which can be used for correcting captured voltage waveforms; and/or other calibration data. In a preferred embodiment, the functional relationship and the parasitic impedance are determined by transforming the captured current and voltage waveforms to the frequency domain. The use of transformation to the frequency domain has the advantage that relatively simple calibration rules can be obtained.

In methods described herein, the ESD test system is preferably applied on at least two predetermined linear systems which have a substantially linear transient response of current and voltage, preferably two ohmic loads, for example a short and a 50 ohm load. The known elements may however also be capacitive or inductive elements such as capacitors, inductances, diodes or other, or a combination thereof.

Once the calibration data have been obtained, they can be stored in a computer-readable format, such as in a digital memory or other storage medium, and used for correcting waveforms which are captured by means of the ESD test system over a device under test. This correction preferably also comprises a transformation to the frequency domain. The corrected waveforms may then be displayed, for example on a computer monitor, an oscilloscope, or in the output of a printer.

Note that transformation to the frequency domain is not essential in the calibration and testing methods described herein. Other possible techniques to determine the calibration data are wavelet decomposition, convolution in the time domain, among others.

In embodiments described herein, the probe needles can comprise multiple pairs of probe needles. Calibration steps can be performed for each pair of probe needles. This calibration can be performed either consecutively or simultaneously.

It is hoped that the methods described herein can provide a technique for calibrating transient behaviour an ESD test system in such a way that the ESD test system becomes more widely applicable. It is also hoped that these methods provide the ability to obtain, with good accuracy, simultaneous current and voltage waveforms.

DETAILED DESCRIPTION

Figure 1:
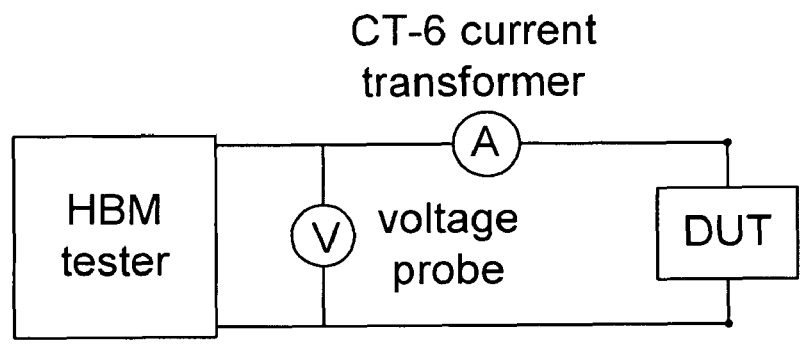
FIG. 1 shows a schematic diagram of a measurement setup.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to the dimensions of actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

The term "comprising", used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the following, certain embodiments of the invention using an HBM test system are described, but it should be noted that the invention can also be applied on MM, TLP or other ESD test systems known to the person skilled in the art. In the embodiments described in detail, the calibration is performed by transferring to the frequency domain. It should be noted that the invention can also be applied in the time domain. In that case, the transfer function TF and the parasitic impedance Zp can be determined on the basis of the principles which are well known in literature, e.g. System Identification—Theory For the User, 2nd ed, PTR Prentice Hall, Upper Saddle River, N.J., 1999, which is incorporated herein by reference in its entirety.

I. INTRODUCTION

Transmission Line Pulse (TLP) testing is a common measurement method to assess the device behavior of devices under Electrostatic Discharge (ESD) stress. It is mainly used as research tool. Final product qualification for ESD robustness is usually done using 'pass-fail' human body model (HBM) testing. Several publications have discussed the correlation/miscorrelation between HBM and TLP. The use of on-wafer HBM measurements as a device characterization and research tool has also been presented. Current and voltage are simultaneously captured during wafer-level HBM testing (HBM IV) for accelerating the wafer-level characterization of ESD protection devices. The use of the described methodology results in an IV curve obtained from a HBM test in a few seconds whereas a TLP test would take several minutes to obtain the same results. Until now, the studies focused on the quasi-static part of the HBM IV curve. Without the determination of the parasitic elements in the measurement system, the transient device behavior during an HBM stress cannot be measured and studied.

Below, improved methods are presented for capturing voltage and current during a HBM pulse. These exemplary methods can include a full quantification of all parasitic elements in the measurement system. The voltage overshoot phenomenon that occurs during triggering of silicon-controlled rectifier devices is studied for the first time using an HBM system to demonstrate the capability of this new methodology for advanced device analysis.

II. METHODOLOGY

The measurement setup is shown in FIG. 1. The ESD test system comprises a commercial wafer-level HBM tester (Hanwa HED-W5000M), which creates HBM pulses according to the ESDA standard, and current and voltage measurement equipment added at the probe connectors of the HBM tester. By adding these, the system is capable of simultaneously capturing voltage and current over time at a device under test during a simulated HBM stress. This allows generation of an HBM IV curve, provided that the system is properly calibrated, for example as presented below. In the wafer-level tester setup used here, the voltage over time is captured by a commercial voltage probe (Tektronix) with 500 MHz bandwidth and an 8 nF capacitance. Current over time is captured by a Tektronix CT-6 current transformer with a frequency response of 250 kHz to 2 GHz.

Due to the limitation for lower frequencies of this current transformer, the HBM current waveform is distorted and shows negative values. Study has also shown that parasitic elements in the measurement setup, such as the inductance ($L_p$) and resistance ($R_p$) of the probe needles, influence the voltage waveform measurements. To remove the low frequency distortion of the current transformer, the transfer function TF of the current transformer is determined by the calculation of the real current $I_{corr}$ out of the measured current $I_{CT}$:

$$I_{corr} = TF \cdot I_{CT} \quad (1)$$

This corresponds to a de-convolution problem, where the determination of an unknown input signal is calculated from the measured output signal if the transfer function of the system is known.

Figure 2:
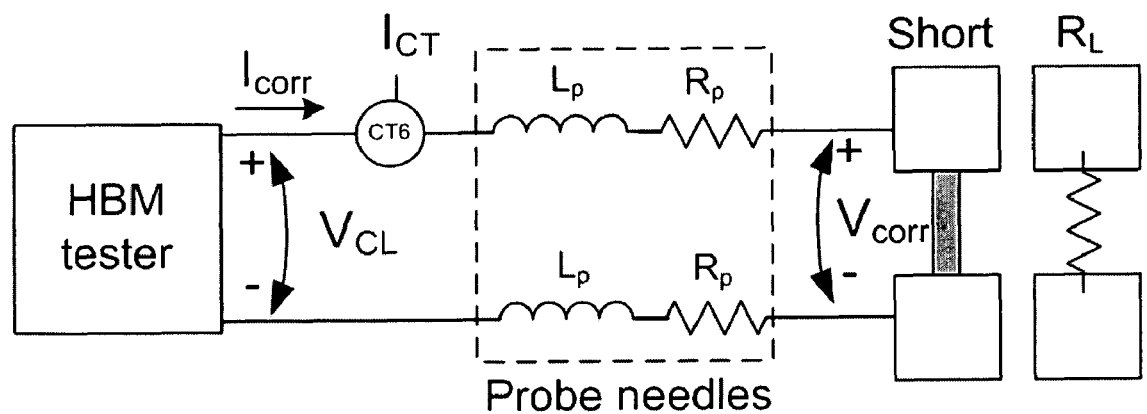
FIG. 2 shows another schematic diagram of the measurement setup of FIG. 1.

Transfer function TF and the needle parasitics $R_p$ and $L_p$ are calculated from HBM voltage waveforms $V_{cl}$ and current waveforms $I_{ct}$ which are captured on a known resistive load $R_L$ and on a short (FIG. 2).

Measured voltage $V_{cl}$ and current $I_{CT}$ are transformed to the frequency domain. Two expressions of the transfer function are obtained—one for the load $R_L$ (2) and one for the short (3) measurement.

$$TF_{cl}^{load} = \frac{I_{corr}^{load}(\omega)}{I_{CT}^{load}(\omega)} = \frac{V_{cl}^{load}(\omega)}{(R_L + Z_P) \cdot I_{CT}^{load}(\omega)} \quad (2)$$

$$TF_{cl}^{short} = \frac{I_{corr}^{short}(\omega)}{I_{CT}^{short}(\omega)} = \frac{V_{cl}^{short}(\omega)}{Z_P \cdot I_{CT}^{short}(\omega)} \quad (3)$$

$$Z_P = 2 \cdot (R_P + j\omega L_P) \quad (4)$$

where $Z_P$ is the impedance of the needles. Both transfer functions are identical as they are obtained with the same current transformer and on the same setup:

$$\frac{V_{cl}^{short}(\omega)}{Z_P \cdot I_{CT}^{short}(\omega)} = \frac{V_{cl}^{load}(\omega)}{(R_L + Z_P) \cdot I_{CT}^{load}(\omega)} = TF \quad (5)$$

From (5), $Z_p$ is obtained as $$Z_P = \frac{V_{cl}^{short}(\omega) \cdot R_L \cdot I_{CT}^{load}(\omega)}{V_{cl}^{load}(\omega) \cdot I_{CT}^{short}(\omega) - V_{CL}^{short}(\omega) \cdot I_{CT}^{load}(\omega)} \quad (6)$$

For the measurement setup described above, a series resistance $R_p$ of 0.8Ω and an inductance $L_p$ of 15 nH are extracted for a single needle. Finally, TF is obtained by substituting (6) in (2) or (3).

To obtain the real current through a device under test (DUT), the measured current waveform $I^{DUT}_{meas}$ is transformed to the frequency domain and multiplied by the transfer function TF (7)

$$I_{corr}^{DUT}(\omega) = TF \cdot I_{meas}^{DUT}(\omega) \quad (7)$$

A corrected voltage waveform across the DUT is calculated by referring to equation (8).

$$V_{corr}^{DUT}(\omega) = V_{meas}^{DUT}(\omega) - Z_P \cdot I_{corr}^{DUT}(\omega) \quad (8)$$

Due to limited power of the signal spectrum at high frequencies, the numerator and denominator in equation (2) and (3) become very small. The result is unrealistic values at high frequencies that have to be removed before the IFFT operation. Therefore, an additional filter is introduced and a minimum phase filter (Bennia-Nahman) was chosen. The corrected current $I^{DUT}_{corr}(\omega)$ and voltage $V^{DUT}_{corr}(\omega)$ waveforms are transformed to the time domain. Finally, current in time is plotted over voltage in time obtained from the same device. The resulting IV curve shows the IV characteristic of the device under test during a HBM stress.

Figure 3:
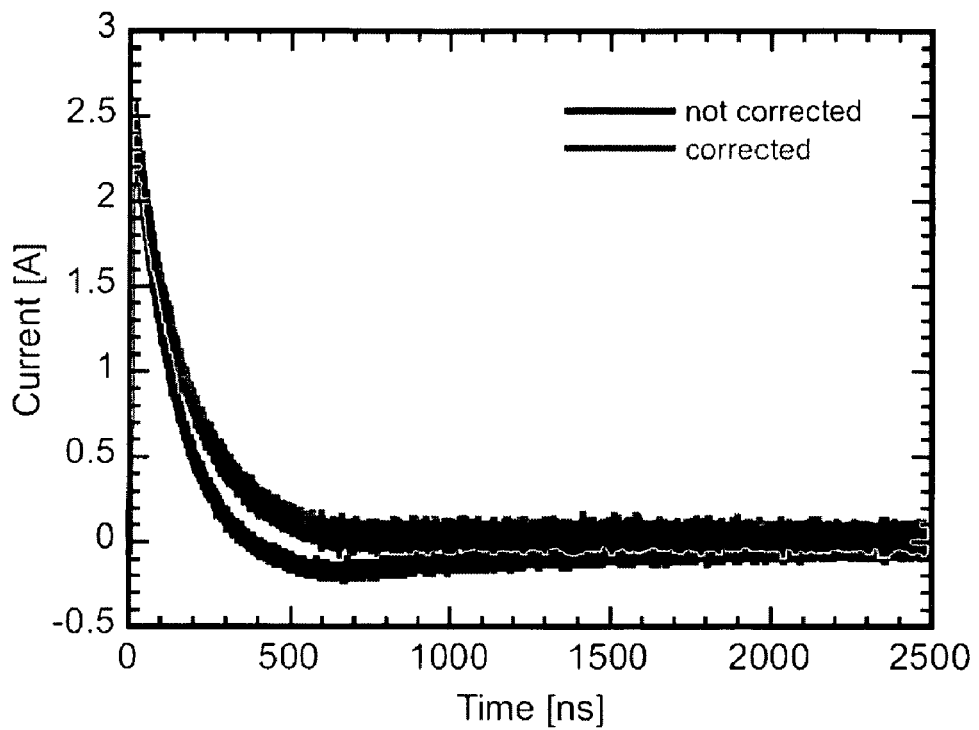
FIG. 3 shows graphs the corrected and uncorrected HBM current waveform.
Figure 4:
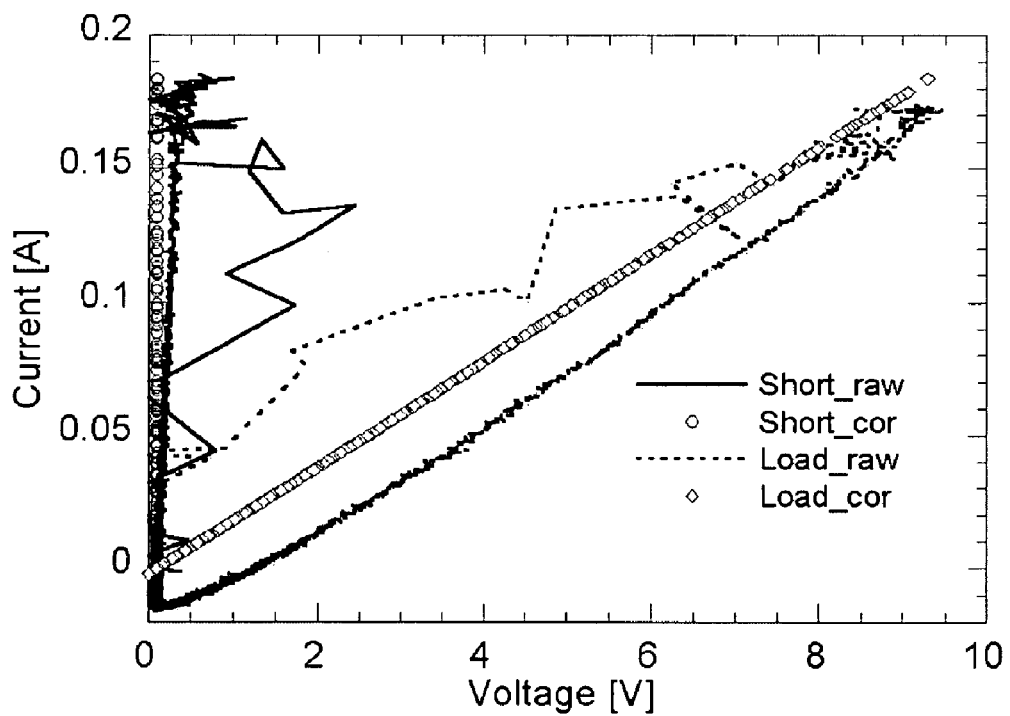
FIG. 4 graphs the corrected and uncorrected HBM IV curves obtained from a short and from a 50Ω load (_raw— uncorrected data, _corr—corrected data).

After calibration of the current transformer, the decaying part of the current pulse is corrected and the negative part is removed (FIG. 3). FIG. 4 shows HBM IV curves for a short and a 50Ω load before and after the calibration. The improvement of the measurement results is visible. Overshoots caused by the system parasitics and serial resistances are removed.

III. MEASUREMENTS AND RESULTS

To study the described methodology, measurements are performed with typical ESD protection devices like n-well shallow trench isolated (STI) diodes, grounded-gate NMOS (ggNMOS) and low-voltage triggered silicon-controlled rectifier (LVTSCR) devices manufactured in a standard 90 nm IMEC technology. First an HBM 'pass-fail' test is performed to obtain the failure level of the tested devices. During the pass-fail testing, voltage and current over time are captured. Additional TLP measurements are performed to compare with the commonly-used method. To ensure comparability between HBM and TLP data, the parasitic voltage drop caused by the serial resistance in the TLP system is removed from the voltage waveforms.

Figure 5:
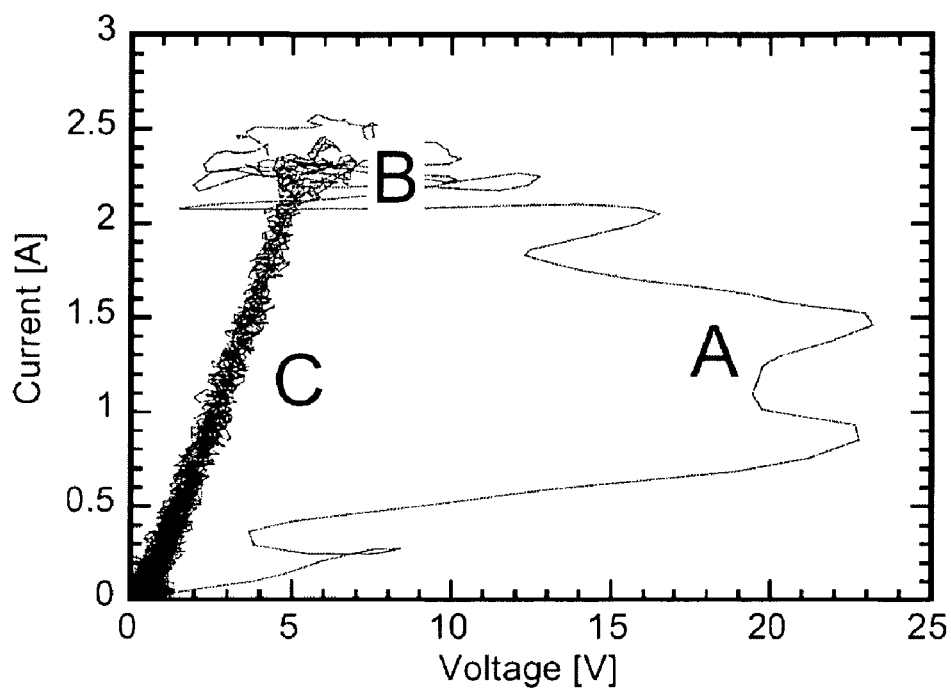
FIG. 5 graphs an HBM IV curve of an n-well STI diode, stress level: 3 kV.

An analysis of the uncorrected HBM IV curve (FIG. 5) reveals three distinct regions: a strong voltage overshoots region (A), an oscillating region (B) and a very stable linear region (C). The voltage overshoot region A is attributed to parasitic elements in the measurement system and to transient response of the device. Region B shows oscillations in both the voltage and the current waveforms around the peak current region of the HBM pulse. The linear region C corresponds to the IV curve from the HBM tester after the current reaches the maximum level.

Out of a TLP IV curve, the level of device failure $I_{T2}$, the on-resistance $R_{ON}$ and for snapback devices the holding voltage $V_H$ can be extracted. Due to lack of accuracy of commercially available current transformer the point of device breakdown in TLP ($V_{T1}$, $I_{T1}$) is better obtained from DC measurements. Similar information can be obtained from HBM testing. The on-resistance is the slope of the linear region in an HBM IV curve. For snapback devices also the holding voltage can be extracted (FIG. 6).

Figure 6:
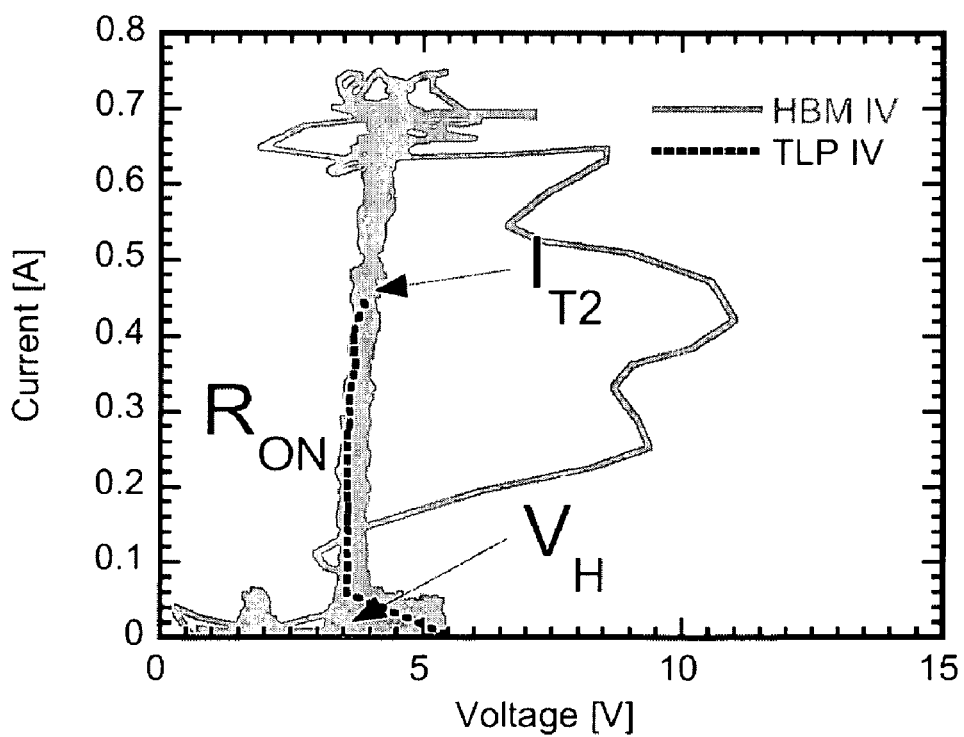
FIG. 6 graphs IV curves for a ggNMOS device (I=0.1 μm, w=50 μm) extracted from a 900 V HBM pulse and TLP: $R_{ON}$—on-resistance, $V_H$—holding voltage, $I_{T2}$—failure level TLP.

A. Grounded-Gate NMOS:

FIG. 6 shows the overlay of TLP and HBM IV curve data for a snap-backing ESD protection device. The holding voltage $V_H$ in the HBM IV curve of the measured grounded-gate NMOS device is correlating to the one in the TLP curve. The on-resistance $R_{ON}$ also shows good correlation between HBM and TLP. The TLP failure level $I_{T2}$ is not determined in the HBM IV curve but known from HBM pass-fail testing.

Figure 7:
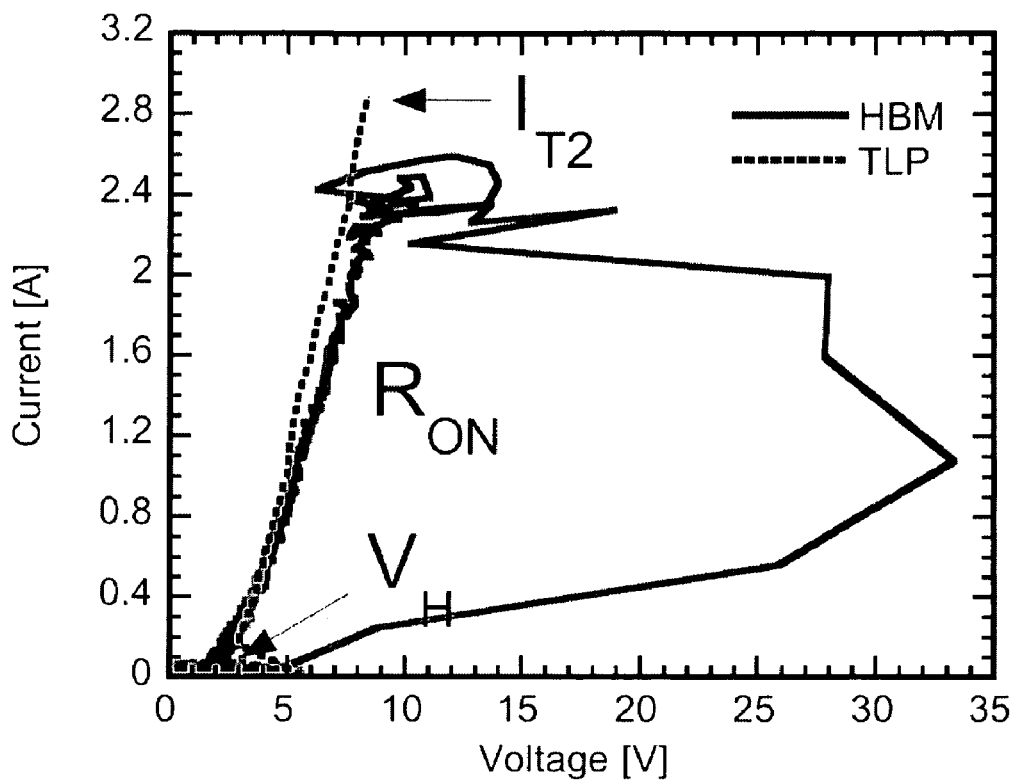
FIG. 7 graphs IV curves for an LVTSCR device (w=50 μm, I=1 μm) extracted from a 4000 V HBM pulse and TLP: $R_{ON}$—on-resistance, $V_H$—holding voltage, $I_{T2}$—failure level TLP.

B. Low-Voltage Triggered SCR:

FIG. 7 shows the IV curves of a low-voltage triggered silicon controlled rectifier device. The comparison of these curves show very similar holding voltages. However, the extracted on-resistance from the HBM IV curve at higher stress levels shows a small deviation from the TLP measurement.

Figure 8:
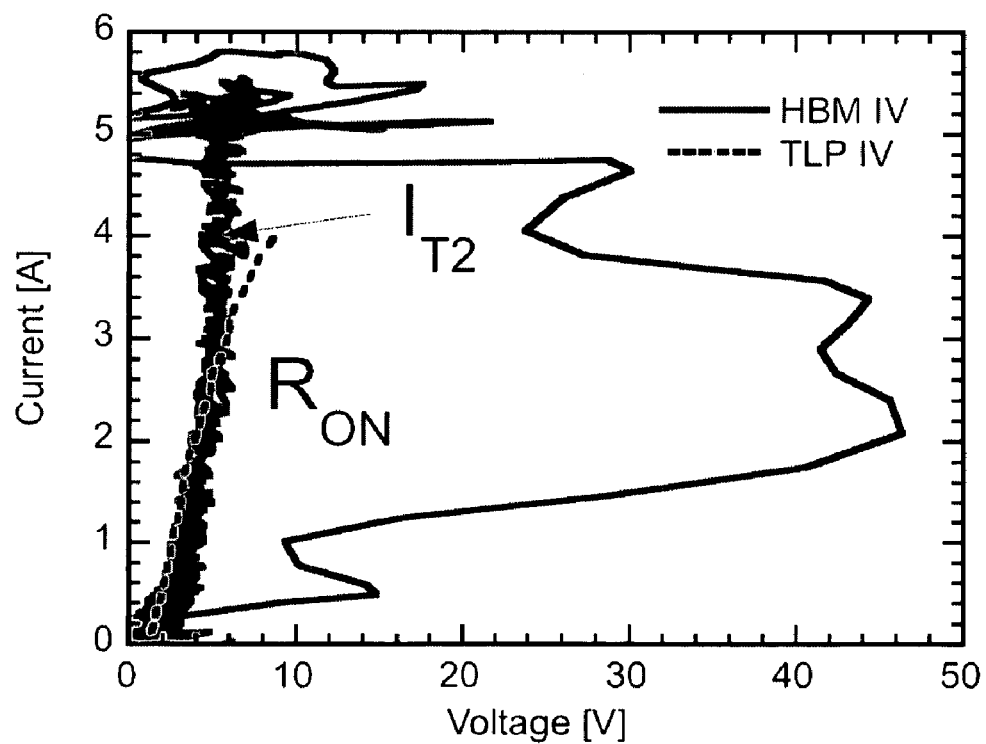
FIG. 8 graphs IV curves for an n-well STI diode (I=50 μm, w=0.35 μm) extracted from a 7000 V HBM pulse and TLP: $R_{ON}$—on-resistance, $I_{T2}$—failure level TLP.

C. Diode:

FIG. 8 shows the overlay of TLP and HBM IV curve data for an n-well shallow trench isolated diode. The on-resistant in the HBM IV curve does not perfectly correlate with the on-resistant during TLP testing. This observation could be caused by different self heating in HBM and TLP. During HBM testing, the diode is heated up for a short time at the beginning of the pulse, whereas in TLP the device is heated up continuously during the TLP pulse length with a constant power. The maximum of dissipated energy is reached much faster during TLP than during HBM stress like it is shown in section E.

D. Device Failure

In addition to the extracted IV characteristics of a given device, the new measurement technique can also reveal the degradation of a device during HBM stress.

Figure 9:
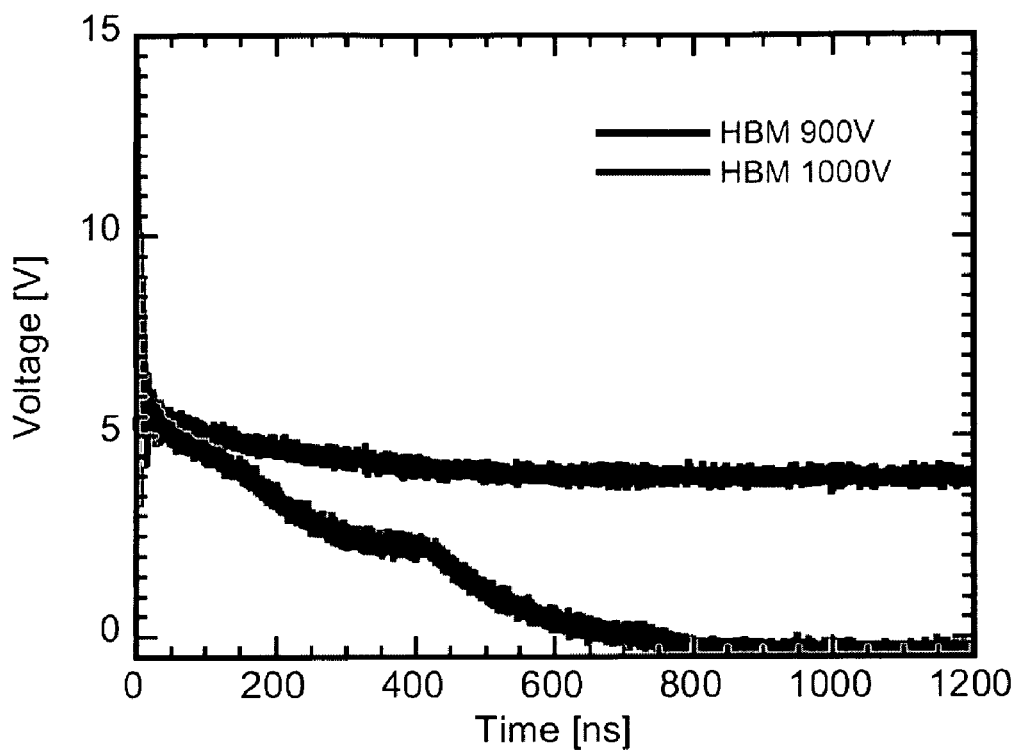
FIG. 9 graphs a HBM voltage waveform for a ggNMOS device (w=50 μm, I=0.1 μm) before (900 V) and during failure (1000 V).

FIG. 9 shows the voltage waveforms of a grounded-gate NMOS device at two different HBM stress levels. The first waveform at 900V displays a normal functional device characteristic while the second one shows the device failure at a stress level of 1000V. Further, the time-domain information reveals that after around 100 ns the device is failing.

Figure 10:
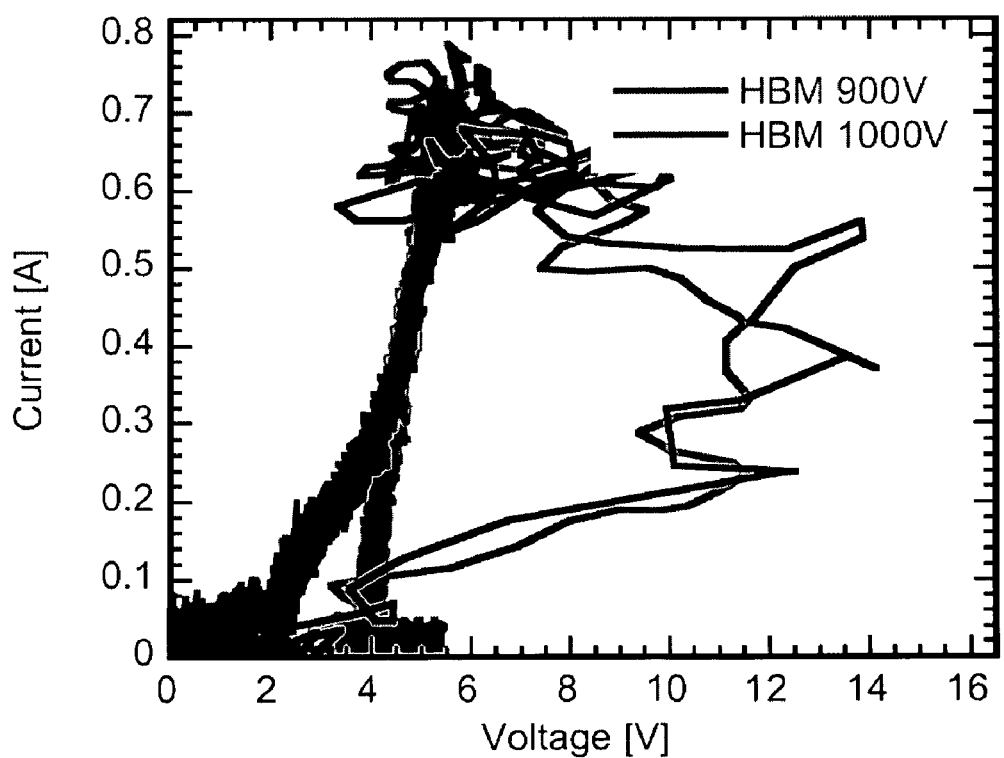
FIG. 10 graphs a HBM IV curve for a ggNMOS device (w=50 μm, I=0.1 μm) before (900 V) and during failure (1000 V).

Extracting the IV-curve from these data sets also shows the device failure (FIG. 10), wherein the linear part of the HBM IV curve of the failing device is no longer following the TLP IV-curve.

E. Energy During an HBM Stress:

Capturing voltage over time V and current over time I enables the calculation of the energy E dissipated during an HBM stress according to equation (9).

$$E = \int V \cdot I \cdot dt \qquad (9)$$

Figure 11:
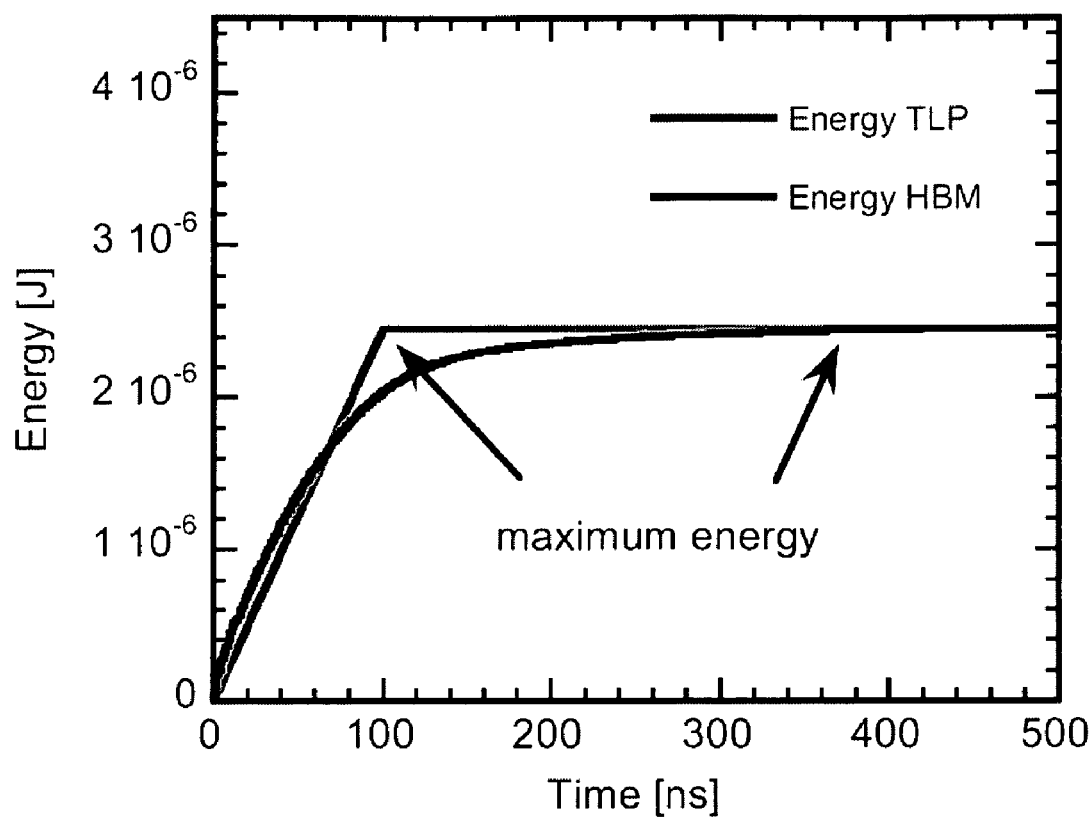
FIG. 11 graphs the energy over time for a n-well STI diode (I=50 μm, w=0.35 μm) extracted from a 7000 V HBM pulse and the corresponding TLP pulse.

FIG. 11 shows the dissipated energy over time for an HBM stress in comparison to the dissipated energy during a TLP stress on the same device. The energy is increasing faster during 100 ns TLP than during an HBM stress. The maximum of dissipated energy is reached after 100 ns in TLP but around 370 ns in HBM testing. This behavior is caused by the different pulse shapes of the two test methods. A TLP pulse is rising with typical 2 ns rise time and staying on a constant level during 100 ns. HBM pulses are rising with rise times between 2 ns and 10 ns. After the current peak HBM pulses decay with a time constant between 130 ns and 170 ns. The differences in the pulse shapes can cause mis-correlations in the comparison of failure levels obtained from a device measured with both testing methods.

IV. FURTHER MEASUREMENTS AND RESULTS

Figure 12:
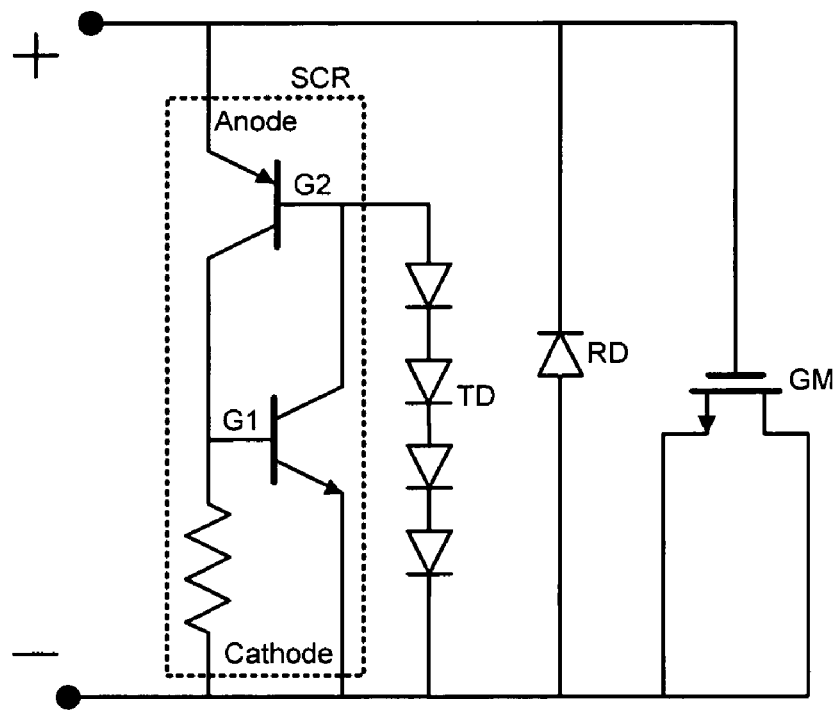
FIG. 12 graphs the schematic of a diode triggered silicon-controlled rectifier with gate-monitor in parallel.

To study and demonstrate the capability of the described methodology, HBM measurements are performed on diode triggered silicon-controlled rectifier (SCR) devices to study their trigger speed (See M. Mergens et al., "Diode-triggered SCR (DTSCR) for RF-ESD protection of BiCMOS SiGe HBTs and CMOS ultra-thin gate oxides", p. 21.3.1-21.3.4, IEDM 2003; and C. J. Brennan et al., "Implementation of diode and bipolar triggered SCRs for CDM robust ESD protection in 90 nm ASICS", Proc. EOS/ESD Symp., p. 380-386, 2005). Devices with four trigger diodes as shown in FIG. 12 are used, to ensure low leakage during normal operation at bias conditions of 1.8V. The number of diodes also defines the trigger voltage of the protection device. To compare the HBM results with the common test method, TLP measurements are performed on fresh devices.

Three different circuit variations A, B and C are used. Type A is the reference circuit with small trigger diodes TD and a small Anode-G2 junction inside the SCR. Type B is a speed-optimized version of Type A, where both the trigger diodes and the Anode-G2 junction are made equally wide as the SCR body. A further proposed speed improvement is provided by Type C. The same sizes are kept as in Type B but both the Anode-G2 junction and the trigger diodes are changed from shallow-trench-isolated (STI)-defined to poly-defined or gated. This is summarised in Table 1.

TABLE 1

Summary of the compared device types

| | Type A | Type B | Type C |
|---|---|---|---|
| Device | SCR_ref | SCR_all_STI | SCR_all_poly |

TLP (transmission line pulsing) measurements are performed on all three SCR types. They yield similar results (Table 2).

TABLE 2

TLP-IV parameters for the three types of SCR:

|  | Type A | Type B | Type C |
|---|---|---|---|
| $V_H$ (V) | 1 | 1 | 1 |
| $V_{t1}$ (V) | 4.2 | 3.8 | 3.8 |
| $R_{on}$ (Ω) | 1.1 | 1.1 | 1.2 |
| $I_{t2}$ (A) | 1.9 | 1.9 | 1.9 |

$V_H$ - holding voltage,
$V_{t1}$ - triggering voltage,
$R_{on}$ - on-resistance,
$I_{t2}$ - TLP failure level When measuring these three types of SCR devices in a configuration with a gate monitor GM in parallel, the acquired results are varying. $I_{t2}$ is much lower than expected, indicating a voltage overshoot during the TLP pulse that damages the gate oxide of the monitor (Table 3). These voltage overshoots limit the ESD robustness of the device types A and B. For device type C, no failure due to oxide breakdown was observed. It fails due to SCR failure and hence it yields the same robustness as without a gate monitor.

TABLE 3

TLP and HBM failure levels for the three types of SCR devices with a gate monitor in parallel

|  | Type A | Type B | Type C |
|---|---|---|---|
| Device | SCR_ref | SCR_all_STI | SCR_all_poly |
| $I_{t2}$ (A) | 0.7 | 1.45 | 1.9 |
| HBM (kV) | 0.5 | 2.6 | 4.6 |

Figure 13:
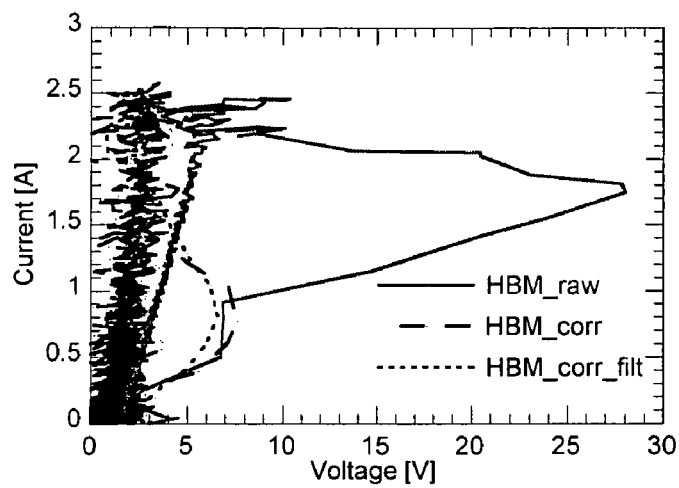
FIG. 13 graphs HBM IV curves obtained from a 4 kV HBM pulse applied to the device of FIG. 12, type A: (HBM_raw— uncorrected data, HBM_corr—corrected data, HBM_corr_filt—corrected and filtered data).

To demonstrate the calibration methodology, a 4 kV HBM pulse is first applied to a type A SCR device without a gate monitor. FIG. 13 shows the obtained HBM IV curves of raw, corrected and corrected-filtered measurement data. The influence of the system parasitic can be clearly seen. Without correction of measurement data the voltage overshoot is much higher (28V peak) than the one after correction (7V peak). Also the linear part of the HBM IV curve is different. The slope (or on-resistance) is lower after applying the calibration methodology to the measurement data. The filtering removes the noise from the linear part of a HBM IV curve but also reduces slightly the overshoot voltage.

Figure 14:
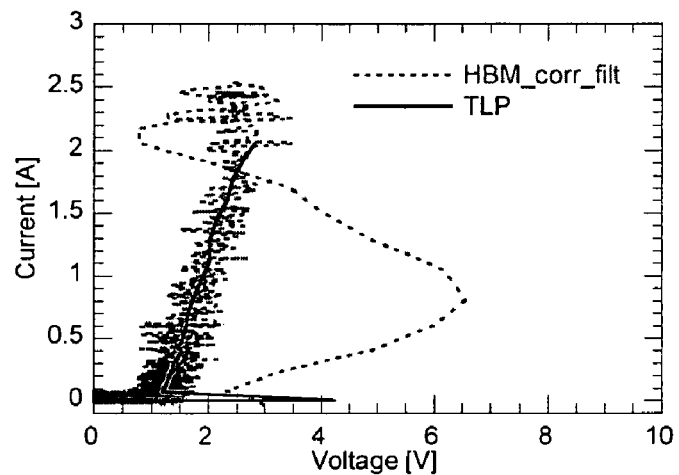
FIG. 14 graphs an overlay of 4 kV HBM IV and TLP IV obtained from the device of FIG. 12, type A.

An overlay of the fully corrected and filtered HBM IV curve with the TLP IV curve obtained from the same device type A shows good correlation (FIG. 14). Holding voltage and on-resistance are identical for HBM and TLP. Depending on the type of SCR $I_{t2}$ is lower for the configuration with a gate monitor in parallel. Therefore HBM pulses with corresponding HBM stress level below the lowest $I_{t2}$ value are used to compare the HBM IV of the different device types A, B and C.

Figure 15:
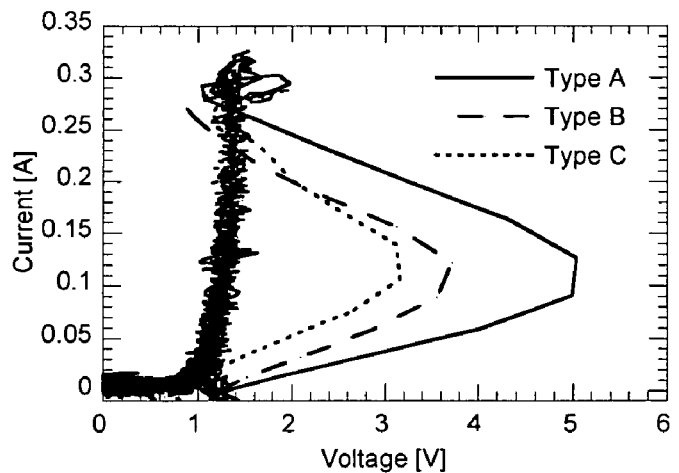
FIG. 15 graphs HBM IV curves obtained from the different devices of FIG. 12, types A, B and C, at HBM stress level 500 V HBM.
Figure 16:
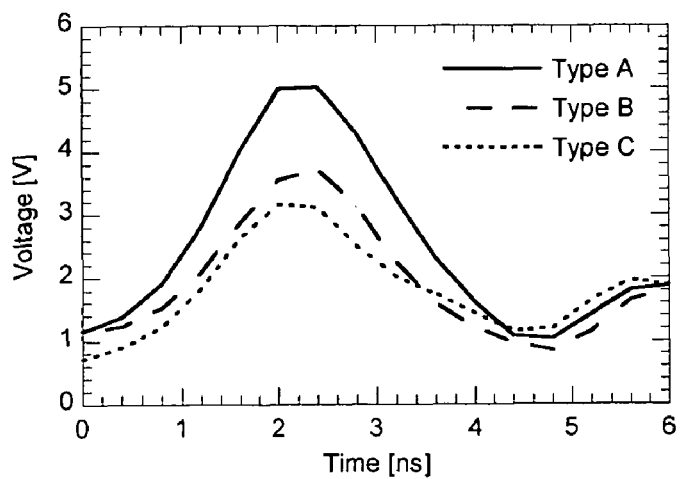
FIG. 16 graphs an overlay of HBM voltage waveforms obtained from the different device types—focus on rising (overshoot) part, HBM stress level: 500V.

FIG. 15 and FIG. 16 demonstrate that the different types A, B and C show a different transient behavior for the same HBM pulse amplitude. FIG. 15 shows HBM IV curves obtained from the different devices with a HBM stress level of 500 V HBM. FIG. 16 shows an overlay of HBM voltage waveforms obtained from the different device types A, B and C with a focus on the rising (overshoot) part, at HBM stress level 500V. The results show that device type A is the slowest device and builds up the highest overshoot voltage during the rising of the HBM pulse. Device type B triggers faster than type A and therefore builds up less overshoot. The highest improvement can be obtained by using poly instead of STI for the trigger diodes and inside of the SCR. Device type C builds up the lowest overshoot which corresponds to the highest trigger speed (i.e. shortest trigger time) in comparison to type A and B. This leads to an increased HBM robustness when stressing the configuration with gate monitor in parallel (Table 3). Due to the improvements, type C fails at a HBM stress level of 4.6 kV whereas type B fails at 2.6 kV.

Figure 17:
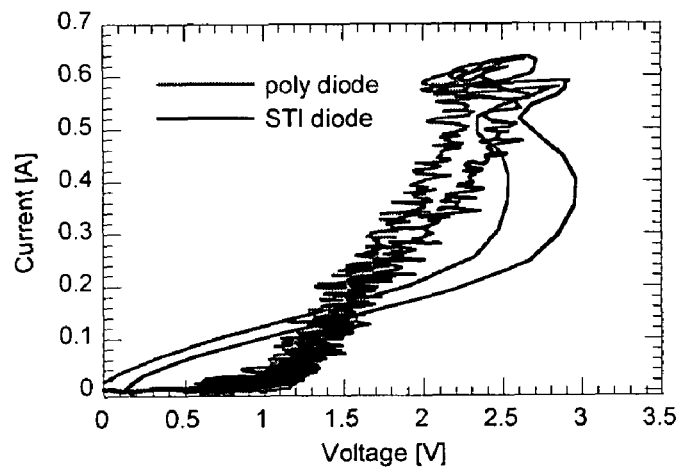
FIG. 17 graphs an overlay of HBM IV curves obtained from a poly and a STI diode of the same width and spacing between n+ and p+ active, HBM stress level: 1000 V.

Comparing the transient behavior of the poly/gated and STI diodes gives more understanding of the different transient behavior of the circuit of FIG. 12 type A, B and C. FIG. 17 shows an overlay of HBM IV curves obtained from a poly and a STI diode of the same width and spacing between n+ and p+ active, at HBM stress level 1000V. This figure shows the transient behavior of an STI diode and a poly diode during the same HBM stress. The overshoot voltage of the STI diode is higher which is due to a slower device triggering. Due to their lower base length, poly diodes trigger faster than STI diodes. In poly diodes the current can flow horizontally and does not have to flow below the STI. Poly diodes can be designed to be even faster because of the lower allowed spacing between n+ and p+ active in comparison to STI diodes. Additionally the on-resistance of the poly diode is lower.

Figure 18:
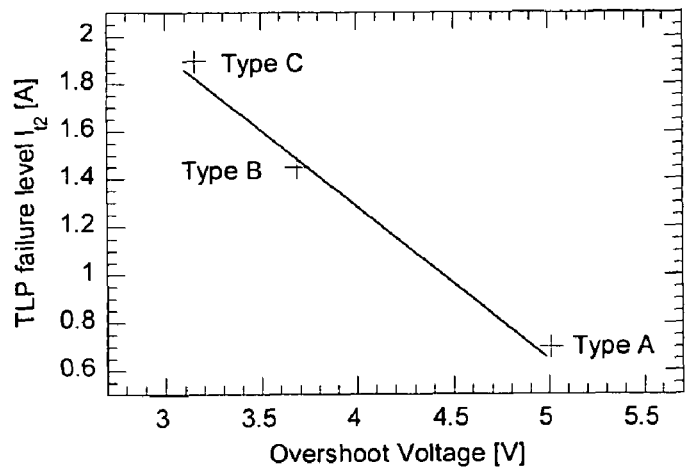
FIG. 18 graphs the correlation between $I_{t2}$ obtained from TLP testing and overshoot peak voltages obtained from 500 V HBM stress for the different device types A, B and C.

These results can be used to explain the different TLP failure level $I_{t2}$ of the device types A, B and C with a gate monitor in parallel. Overshoot voltages occurring during the HBM stress cause the failure of the gate monitor. Therefore in respect to the peak value of the overshoot voltages a clear correlation is found to $I_{t2}$ obtained during TLP stress. This is illustrated by FIG. 18 which shows a correlation between $I_{t2}$ obtained from TLP testing and overshoot peak voltages obtained from 500 V HBM stress for the different device types. Slow device triggering and the resulting high overshoot voltage are directly corresponding to a low TLP failure level $I_{t2}$.

V. MULTI-PORT ESD TEST SYSTEM

The above described ESD testing setup included one tester and one pair of probe needles. In this section, a multi-port ESD test system, with multiple pairs of probe needles, is proposed. A multi-terminal device or circuit is stressed with one (or more) ESD tester(s), and voltage and current in time are measured at two or "N" terminals. The number of terminals is only limited in the available measurement pins/pads at the device under test and/or the available measurement channels for the voltage and current waveform capturing.

Figure 19:
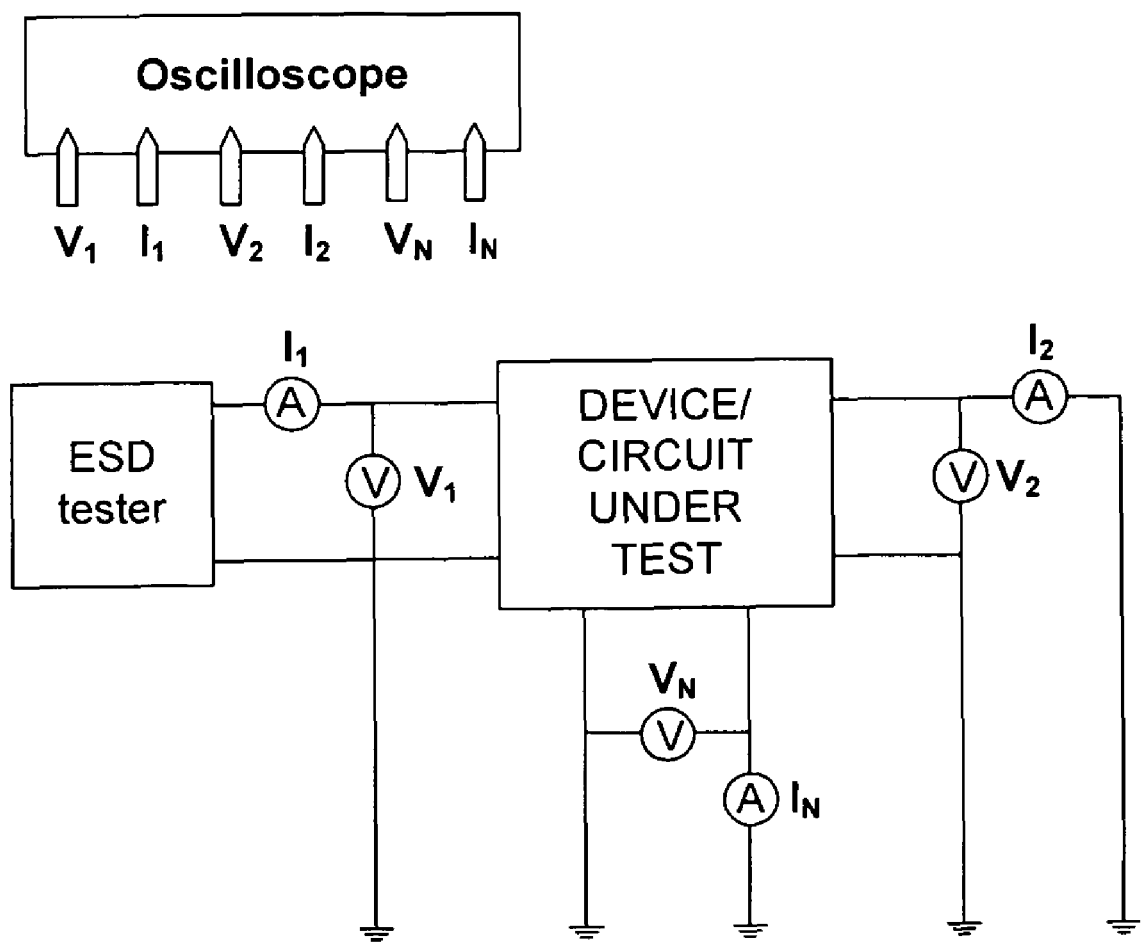
FIG. 19 is a schematic diagram of a multi-port ESD test setup with two or "N" measurement ports.

FIG. 19 shows the schematic of such a multi-port ESD test system. Voltage and current in time are measured for an "N" number of terminals of a device or circuit under test. To obtain these waveforms, "N" voltage probes and "N" current transformers are used. Furthermore a system for the capturing and displaying of these waveforms is provided. Such a system is represented in FIG. 19 by an oscilloscope with "N" input channels.

Each measurement port can be also configured like port one in FIG. 19 by connecting another ESD tester to it. With such a configuration it is possible to stress the device or circuit under test at different ports and measure the resulting voltage and current in time simultaneously at any of the available ports.

Software for controlling the instruments and processing the measurement data is used. This software can include a suitable scaling method for capturing the waveforms at the measurement ports.

Figure 20:
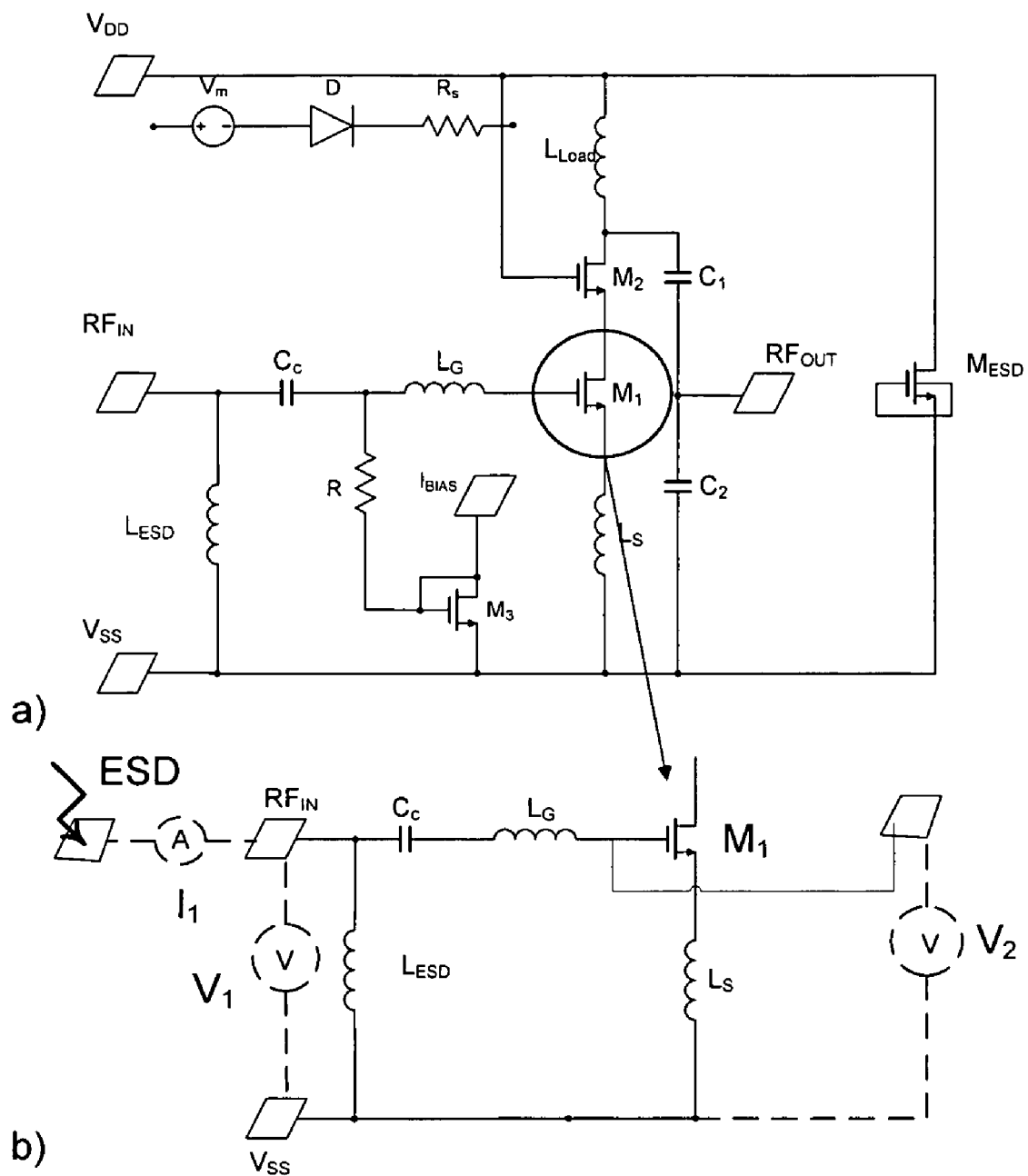
FIG. 20 illustrates (a) a schematic diagram of an ESD protected low-noise amplifier (LNA); and (b) a schematic diagram of a setup for multi-port ESD testing: $V_1$—voltage waveform at RF input, $I_1$—current waveform at RF input, $V_2$—voltage waveform at gate of transistor $M_1$.

FIG. 20 shows a practical example for determining the gate voltage of a transistor in an ESD protected LNA circuit under ESD stress conditions.

FIG. 20a shows the schematic of an ESD protected low-noise amplifier (LNA) circuit. The protection circuit protects the transistor $M_1$ against ESD like stresses which are inserted between the RF input and $V_{SS}$ in the circuit. For the qualification of the designed ESD protection it is important to know the voltage level reached at the gate of transistor $M_1$ during an ESD event. If this voltage is higher than the oxide breakdown voltage of transistor $M_1$ the transistor will fail. In this case the ESD protection is not well designed and calls for a redesign to protect reliably the underlying LNA circuit.

A test structure is disclosed here to determine the voltage $V_2$. A monitoring pad connected to the gate of transistor $M_1$ is added to the LNA circuit design (FIG. 20b). Different levels of ESD stresses are applied between $RF_{in}$ and $V_{SS}$. The voltage waveforms $V_1$ and $V_2$ and the current waveform $I_1$ are captured simultaneously. The maximum voltage at the protected transistor M1 during an ESD like stress is obtained from waveform $V_2$.

VI. CONCLUSION

As described herein, a method is provided for deriving IV-curves from single-shot HBM on-wafer voltage and current measurements. This involves an improved full system calibration to remove the system parasitics and the lower frequency limitation of the current transformer. The obtained HBM IV results yield similar quasi-static parameters as from TLP measurements, but can be acquired in much less time.

In addition to quasi-static device parameters, HBM-IV also allows the study of the transient behavior of devices under HBM stress. An example is the above described case study where HBM-IV is used to compare the triggering behavior of different types of ESD protection devices and is found to correlate to TLP measurements with an additional gate monitor. This makes the HBM-IV method an excellent tool for fast on-wafer device research under HBM stress.

Since the measurement setup described herein is also capable of delivering MM pulses, a similar approach could be used to study device and circuit response under MM stress conditions.

The invention claimed is:

1. A method for calibrating transient behaviour of an electrostatic discharge test system comprising:
   a) operating the electrostatic discharge test system to apply a first electrostatic discharge test pulse to a known first device, wherein the first device has a known first impedance during an electrostatic discharge transient;
   b) simultaneously capturing first voltage and current waveforms generated in response to the application of the first pulse to the first device;
   c) operating the electrostatic discharge test system to apply a second electrostatic discharge test pulse to a known second device, wherein the second device has a known second impedance during an electrostatic discharge transient that is different from the first impedance;
   d) simultaneously capturing second voltage and current waveforms generated in response to the application of the second pulse to the second device;
   e) based on the first and second voltage and current waveforms and the first and second known impedances, determining calibration data for the transient behaviour of the electrostatic discharge test system, wherein the calibration data represents at least one of i) a transfer function and ii) an impedance of the electrostatic discharge test system; and
   f) storing the calibration data on a computer-readable storage medium.

2. A method according to claim 1, wherein the calibration data comprises a functional relationship to be applied to a current waveform captured by means of the measurement equipment for obtaining a corrected current waveform.

3. A method according to claim 2, wherein the functional relationship is determined by transforming the captured first and second current and voltage waveforms to the frequency domain and determining a transfer function for both the first and second current waveforms.

4. A method according to claim 1, wherein the electrostatic discharge test system applies the electrostatic test pulses through probe needles, and wherein the calibration data comprises a parasitic impedance of the probe needles.

5. A method according to claim 4, wherein the parasitic impedance is determined from the captured first and second current and voltage waveforms transformed to the frequency domain.

6. A method according to claim 1, wherein the first and second devices each have a substantially linear response of current and voltage.

7. A method according to claim 6, wherein the first and second devices each comprise an ohmic load.

8. A method according to claim 1, wherein the electrostatic discharge test system comprises a plurality of pairs of probe needles, and wherein steps a) through f) are performed for each pair of probe needles.

9. A method according to claim 1, further comprising:
   g) operating the electrostatic discharge test system to apply a third electrostatic discharge test pulse to a device being tested;
   h) simultaneously capturing test voltage and current waveforms occurring over the device being tested as a result of the third pulse;
   i) retrieving the calibration data; and
   j) correcting the voltage and current test waveforms using the calibration data.

10. A method according to claim 9, wherein the calibration data includes a transfer function and a parasitic impedance, and wherein step f) comprises:
    g) transforming the voltage and current test waveforms to the frequency domain;
    h) applying the transfer function to the current test waveform, thereby obtaining a corrected current waveform;
    i) applying the parasitic impedance to the voltage waveform, thereby obtaining a corrected voltage waveform; and
    j) transforming the corrected current and voltage waveforms to the time domain.

11. A method according to claim 9, further comprising displaying the corrected current and voltage waveforms.

12. A method according to claim 10, further comprising displaying the corrected current and voltage waveforms.

13. A method for calibrating transient behaviour of an electrostatic discharge test system comprising:
    operating the electrostatic discharge test system to apply a first electrostatic discharge test pulse to a known first device, wherein the first device has a known first impedance during an electrostatic discharge transient;
    simultaneously capturing first voltage and current waveforms generated in response to the application of the first pulse to the first device;
    operating the electrostatic discharge test system to apply a second electrostatic discharge test pulse to a known second device, wherein the second device has a known second impedance during an electrostatic discharge transient that is different from the first impedance;

simultaneously capturing second voltage and current waveforms generated in response to the application of the second pulse to the second device;

based on the first and second voltage and current waveforms and the first and second known impedances, determining calibration data for the transient behaviour of the electrostatic discharge test system, wherein the calibration data represents at least one of i) a transfer function and ii) an impedance of the electrostatic discharge test system;

operating the electrostatic discharge test system to apply a third electrostatic discharge test pulse to a device being tested;

simultaneously capturing test voltage and current waveforms occurring over the device being tested as a result of the third pulse;

correcting the voltage and current test waveforms using the calibration data.

14. A method according to claim 13, wherein the calibration data includes a transfer function and a parasitic impedance, and wherein the correction of the test waveforms comprises:

transforming the voltage and current test waveforms to the frequency domain;

applying the transfer function to the current test waveform, thereby obtaining a corrected current waveform;

applying the parasitic impedance to the voltage waveform, thereby obtaining a corrected voltage waveform; and transforming the corrected current and voltage waveforms to the time domain.

15. A method according to claim 13, further comprising displaying the corrected current and voltage waveforms.

16. A method according to claim 14, further comprising displaying the corrected current and voltage waveforms.

17. A method for calibrating transient behaviour of an electrostatic discharge test system comprising:

operating the electrostatic discharge test system to apply electrostatic discharge test pulses to at least three devices, wherein at least a first and second device have predetermined impedances different from one another;

recording voltage and current waveforms generated in response to the test pulses on the respective devices;

based on the voltage and current waveforms generated in response to the test pulses on the first and second device, correcting the voltage and current waveforms generated in response to the test pulse on the third device to generate corrected waveforms.

18. A method according to claim 17, further comprising displaying the corrected voltage and current waveforms.

19. A method according to claim 17, wherein correcting the voltage and current waveforms comprises:

determining a transfer function and a parasitic impedance associated with the electrostatic discharge test system;

transforming the voltage and current waveforms generated on the third device to the frequency domain;

applying the transfer function to the transformed current waveform, thereby obtaining a corrected current waveform;

applying the parasitic impedance to the transformed voltage waveform, thereby obtaining a corrected voltage waveform; and transforming the corrected current and voltage waveforms to the time domain.

20. A method according to claim 19, further comprising displaying the corrected voltage and current waveforms.

* * * * *

UNITED STATES PATENT AND TRADEMARK OFFICE
CERTIFICATE OF CORRECTION

PATENT NO. : 7,821,272 B2  
APPLICATION NO. : 12/051749  
DATED : October 26, 2010  
INVENTOR(S) : Mirko Scholz et al.

It is certified that error appears in the above-identified patent and that said Letters Patent is hereby corrected as shown below:

On the title page, at item (73), Assignee:

delete "IMEC, Leuven (BE)"

replace with -- IMEC, Leuven (BE); Hanwa Electronics Ind. Co., Ltd. -- .

Signed and Sealed this
Eighteenth Day of January, 2011

David J. Kappos
*Director of the United States Patent and Trademark Office*